(12) United States Patent
Nakashima et al.

(10) Patent No.: US 8,044,498 B2
(45) Date of Patent: Oct. 25, 2011

(54) INTERPOSER, SEMICONDUCTOR CHIP MOUNTED SUB-BOARD, AND SEMICONDUCTOR PACKAGE

(75) Inventors: Moriyoshi Nakashima, Amagasaki (JP); Kazuo Kobayashi, Amagasaki (JP); Natsuo Ajika, Amagasaki (JP)

(73) Assignee: Genusion Inc., Amagasaki-shi (JP)

( * ) Notice: Subject to any disclaimer, the term of this patent is extended or adjusted under 35 U.S.C. 154(b) by 780 days.

(21) Appl. No.: 12/164,503

(22) Filed: Jun. 30, 2008

(65) Prior Publication Data

US 2008/0265433 A1 Oct. 30, 2008
US 2011/0074045 A2 Mar. 31, 2011

Related U.S. Application Data

(63) Continuation of application No. 11/456,913, filed on Jul. 12, 2006, now Pat. No. 7,420,206.

(51) Int. Cl.
*H01L 23/07* (2006.01)
(52) U.S. Cl. ........................... 257/686; 257/777
(58) Field of Classification Search .................. 257/686, 257/777, 723, 724
See application file for complete search history.

(56) References Cited

U.S. PATENT DOCUMENTS

| | | | |
|---|---|---|---|
| 6,545,228 B2 | 4/2003 | Hashimoto | |
| 6,919,631 B1 | 7/2005 | Hoffman et al. | |
| 7,193,331 B2 | 3/2007 | Ishii | |
| 7,309,913 B2 | 12/2007 | Shim et al. | |
| 2001/0026014 A1 | 10/2001 | Sakamoto et al. | |
| 2005/0194673 A1 | 9/2005 | Kwon et al. | |
| 2005/0230800 A1 | 10/2005 | Do et al. | |
| 2006/0060959 A1 | 3/2006 | Hayashi et al. | |
| 2006/0091520 A1 | 5/2006 | Akram | |
| 2006/0113653 A1 | 6/2006 | Xiaoqi et al. | |
| 2007/0132080 A1 | 6/2007 | Nakashima et al. | |
| 2007/0278648 A1 | 12/2007 | Akram | |
| 2010/0320582 A1* | 12/2010 | Pagaila et al. | 257/686 |
| 2010/0320583 A1* | 12/2010 | Camacho et al. | 257/686 |
| 2011/0024888 A1* | 2/2011 | Pagaila et al. | 257/686 |
| 2011/0133325 A1* | 6/2011 | Moon et al. | 257/686 |

FOREIGN PATENT DOCUMENTS

| | | |
|---|---|---|
| JP | 61-059846 | 3/1986 |
| JP | 04-111457 | 4/1992 |
| JP | 2001-196529 | 7/2001 |

(Continued)

OTHER PUBLICATIONS

"Part One: If a Chip Can Not be Used, There is a Package", Nikkei Electronics, Feb. 11, 2002, pp. 108-113, No. 815, Nikkei Business Publications, Inc., Chiyoda-ku, Tokyo, Japan. "Lecture on basic microelectronics packaging technology (vol. 1) general statement", p. 26-28, Jul. 1, 1998, Society for Hybrid Microelectronics.

*Primary Examiner* — Sheila Clark
(74) *Attorney, Agent, or Firm* — Renner, Otto, Boisselle & Sklar, LLP

(57) ABSTRACT

A semiconductor device can be manufactured with a high non-defect ratio, making it possible to easily guarantee the KGD (Known-Good-Die) of semiconductor chips, when configuring one packaged semiconductor device on which a plurality of semiconductor chips is mounted. Utilizing each semiconductor chip is made possible without limits on terminal position, pitch, signal arrangement, and so on.

Protrusions provided to a semiconductor chip mounted sealing sub-board are attached to a package substrate. A plurality of semiconductor bare chips is disposed in a space formed between the semiconductor chip mounted sealing sub-board and the package substrate, making wiring possible.

20 Claims, 15 Drawing Sheets

FOREIGN PATENT DOCUMENTS

| | | |
|---|---|---|
| JP | 2002-040095 | 2/2002 |
| JP | 2002-083897 | 3/2002 |
| JP | 2002-141459 | 5/2002 |
| JP | 2003-100985 | 4/2003 |
| JP | 2003-249606 | 9/2003 |
| JP | 2005-123542 | 5/2005 |
| JP | 2005-209882 | 8/2005 |
| JP | 2005-347470 | 12/2005 |
| JP | 2006-080564 | 3/2006 |
| WO | 2004/034433 | 4/2004 |

* cited by examiner

INTERPOSER, SEMICONDUCTOR CHIP MOUNTED SUB-BOARD, AND SEMICONDUCTOR PACKAGE

CROSS-REFERENCE TO RELATED APPLICATIONS

This application is a continuation of U.S. Non-provisional application Ser. No. 11/456,913 filed Jul. 12, 2006 now U.S. Pat. No. 7,420,206, the contents of which are hereby incorporated by reference.

BACKGROUND OF THE INVENTION

The present invention relates to package design of semiconductor devices.

How to increase a high degree of integration in semiconductor devices is always important in aiming for lighter weight and more compact designs for electronic devices using semiconductor devices such as terminal devices in mobile communication systems (mobile telephone devices). Until now, as many circuits as possible have been combined into a single chip as miniaturization of semiconductor circuits has proceeded apace, and the advantages of miniaturization of mounting surfaces, greater speeds, and lower energy consumption have been put to use. However, the problems of rapidly rising manufacturing costs brought about by miniaturization of semiconductor circuits and longer design and development times have come to the surface.

Accordingly, SIP (System In Package) technology, with which a plurality of semiconductor chips is mounted in three dimensions, has received attention. For example, "Part One: If Chips Don't Work, There's the Package" in "Nikkei Electronics" 2002, 2-11, no. 815, p. 108, describes mounting a semiconductor bare chip 30 on a package substrate 10, further mounting another semiconductor bare chip 31 on the semiconductor bare chip 30, and wire bonding these semiconductor bare chips 30 and 31 to the package substrate 10 with a wire 60, as shown in FIG. 13.

A semiconductor device can be made smaller by placing a plurality of semiconductor chips in a single package, but at the same time this invites a drop in the non-defect ratio (yield). In other words, the non-defect ratio of an SIP is the value of the non-defect ratios of each semiconductor chip multiplied. For example, the non-defect ratio of an SIP with three semiconductor chips, each having a non-defect ratio of 80%, drops to approximately 50% (=0.8×0.8×0.8).

In particular, the non-defect ratio of low-price chips such as DRAMs is lower than the non-defect ratio of logic semiconductor chips such as high-price CPUs, which has led to a problem in that high-price semiconductor chips have been wasted because of defects in low-price semiconductor chips. Accordingly, it is highly desirable that semiconductor chips mounted on SIPs be semiconductor chips which have undergone inspection ahead of time and been verified to be non-defective ("KGD: Known-Good-Die"—inspected, non-defective chips).

Next, a method for achieving KGDs is described. First, a prescribed probe test is performed on each semiconductor chip while still in a wafer. The semiconductor wafer is diced (cut) and the individual semiconductor chips are separated. The semiconductor chips are sorted based on the results of the probe test, and a screening test, such as a burn-in test is further performed on the semiconductor chips which passed the probe test. At this time, the following procedure is performed: the semiconductor chips to be tested are placed in a chip tray or carrier socket for the burn-in test, the burn-in test is performed on the chips using special KGD fixtures and apparatuses, the semiconductor chips are removed from the chip tray or carrier socket for the burn-in test, and only non-defective semiconductor chips are moved to a tray for shipping.

The individual semiconductor chips (bare chips) are formed extremely thinly, meaning they break easily, and extremely sensitive operation is demanded when operating sockets, probes, and testers used in the sorting test.

Japanese Laid-Open Patent Publication No. 2002-40095, for example, discloses a method to resolve these problems.

The semiconductor device disclosed in Japanese Laid-Open Patent Publication No. 2002-40095 is characterized in that an electrode formed on a surface of a first resin-sealed package formed by sealing a semiconductor chip in resin is connected to an electrode of the semiconductor chip and in that a mounting area connected to a mounting object and a testing area for connecting testing equipment are provided. FIG. 14 shows an example of a case in which the semiconductor device disclosed in Japanese Laid-Open Patent Publication No. 2002-40095 is applied to an SIP, and a description follows below with reference to this.

As shown in FIG. 14, a semiconductor package 20 is such that, when mounted on a package substrate 10, a semiconductor package 21 and a semiconductor package 22 are mounted on a lead frame connected to an electrode on the package substrate 10 and sealed in resin by sealing resin 80. At this time, the semiconductor package 21 and the semiconductor package 22 contain a semiconductor bare chip 30 and a semiconductor bare chip 31, respectively, and are each resin-sealed by sealing resin 81. However, when applying the semiconductor devices disclosed in Japanese Laid-Open Patent Publication No. 2002-40095 to an SIP, an electrode 40 of the semiconductor package 21 is connected by a wire 60 to an electrode 41 on the semiconductor 22 on which the semiconductor package 21 is mounted. Further, the electrode 41 on the semiconductor package 22 and the lead frame are connected by a wire 61. The resin-sealed package disclosed in Japanese Laid-Open Patent Publication No. 2002-40095 (the semiconductor package 21 and the semiconductor package 22) is simpler to use than conventional bare chips because it is resin-sealed, and has the effect of reducing the degree of sensitivity demanded in operation of sockets, probes, and testers used in sorting tests.

Further, Japanese Laid-Open Patent Publication No. 2002-40095 is configured such as to eliminate using electrodes damaged by sorting tests during mounting, as the electrodes are separated into electrodes for testing and electrodes for mounting. The following demands are placed on the electrodes for testing and the electrodes for mounting.

First, with regard to the electrodes for testing, the electrode pitch is set to approximately 0.8 mm in, for example, a BGA-type package. If an electrode pitch of this level can be realized, the degree of sensitivity demanded in operation of sockets, probes, and testers used in sorting tests is sufficient at the level of measuring CSPs. On the other hand, with respect to the electrodes for mounting, making the electrode pitch the same as the electrode pitch of ordinary bare chips allows maximum effectiveness. This pitch is, for example, approximately 130 µm. If an electrode pitch of this level can be realized, assembly apparatuses and so on can be used without any particular changes.

A method is disclosed in Japanese Laid-Open Patent Publication No. 2003-249606 which uses an interposer using a glass substrate in order to allow wiring even with the narrow pitch for mounting, described above. However, endowing the arrangement of electrodes for testing and the arrangement of electrodes for mounting with greater freedom faced the problem of an inability to realize user-defined arrangements of electrodes for testing and arrangements of electrodes for mounting, because simply being able to wire even with narrow pitches had a limit.

On the other hand, Japanese Laid-Open Patent Publication No. 2001-196529 provides a wiring method which allows connecting pad electrodes on a semiconductor chip to arbitrary electric connecting portions. FIG. 15 shows the wiring method disclosed in Japanese Laid-Open Patent Publication No. 2001-196529. In FIG. 15, a pad electrode disposed in the vicinity of an edge in the direction of the Y-Y' arrow of a semiconductor bare chip 30 and a pad electrode disposed in the vicinity of an edge in the direction of the X-X' arrow of a package substrate 10 are connected via internal wiring of a semiconductor bare chip 31.

A SIP is realized as described above, but in order to realize a chip-on-chip design in which a plurality of chips is stacked in three dimensions, gaps must be provided in the stacked chips. These gaps act to dissipate heat from semiconductor elements and to protect semiconductor elements during mounting. Further, in a case in which the sizes of the stacked chips are the same or approximately the same, these gaps act to prevent bonding pad portions of lower chips from becoming hidden and unable to be wire bonded when the chips are directly stacked. Means for providing these gaps between stacked chips are known as spacers.

In light of the foregoing issues, the object of the present invention is in providing a structure for easily realizing a semiconductor package constituted by mounting in three dimensions semiconductor bare chips which have been certified as KGD.

SUMMARY OF THE INVENTION

The invention of claim 1 is directed to an interposer in a semiconductor package on which a plurality of semiconductor bare chips is mounted, used for mounting the semiconductor bare chips to a base material of the semiconductor package, comprising: internal electrodes for connecting electrode terminals of the semiconductor bare chips in order to mount the semiconductor bare chips to the interposer; testing electrodes to which are connected terminals of a testing apparatus during a test after mounting the semiconductor bare chips; and mounting electrodes for connecting to other parts when being mounted on the semiconductor package after mounting the semiconductor bare chip;

wherein the electrodes for mounting are formed at the same pitch as the electrode pitch of the semiconductor bare chips, and the electrodes for testing are formed at the same pitch as the electrode pitch of the semiconductor package which is larger than the electrode pitch of the semiconductor bare chips.

The invention of claim 2 is characterized by an interposer according to claim 1, comprising a leg portion for forming a space with the base material of the interposer.

The invention of claim 3 is characterized by mounting a semiconductor bare chip on the interposer according to claim 1, and connecting and sealing in resin electrode terminals of the semiconductor bare chips and the internal electrodes.

The invention of claim 4 is characterized by forming on the resin of claim 3 a leg portion for forming a space with a mounted member during mounting.

The invention of claim 5 or 6 is characterized by mounting and sealing in resin the semiconductor chip mounted sub-board according to claim 3 or claim 4 together with other semiconductor elements on a base material in the shape of a substrate or a frame.

The invention of claim 7 is characterized by providing a leg portion for forming a space with a mounted member during mounting.

The invention of claim 8 or 9 is characterized by mounting and sealing in resin a semiconductor bare chip on an interposer, and forming in the resin a leg portion for forming a space with a mounted member during mounting.

The invention of claim 10 is characterized by mounting and sealing in resin a sub-board constitute by mounting a semiconductor bare chip on the interposer according to claim 7, or the semiconductor chip mounted sub-board according to claim 9, together with other semiconductor elements on a base material in the shape of a substrate or a frame.

With this invention, the semiconductor chip mounted sub-board is constituted by providing internal electrodes, electrodes for mounting, and electrodes for testing. When testing the semiconductor chip mounted sub-board, testing can be performed using a conventional socket method using the electrodes for testing, thereby allowing a reduction of testing costs. When mounting the semiconductor chip mounted sub-board, conventional mounting equipment can be used by using the electrodes for mounting, thereby allowing a reduction of mounting costs. Further, by setting the arrangement pitch of the electrodes for mounting and the arrangement pitch of the electrodes for testing of the semiconductor chip mounted sub-board so as to differ, an arrangement pitch of the electrodes for testing can be selected which is suitable for testing methods, and an arrangement pitch of the electrodes for mounting can be selected which is suitable for mounting conditions.

Further, with this invention, by separately resin sealing the semiconductor chip mounted sub-board and resin sealing the resin-sealed semiconductor chip mounted sub-board and other semiconductor chips on the base material, handling of the resin-sealed semiconductor chip mounted sub-board becomes even simpler, and the degree of sensitivity demanded of testing equipment can be reduced, which in turn allows reduction of testing costs.

Further, with this invention, by providing a leg portion to resin-sealed portions of the semiconductor chip mounted sub-board, this leg portion can be used as a spacer, making it possible to eliminate the space insertion process in the manufacturing process of semiconductor packages.

Further, with this invention, by providing a leg portion to the interposer, this leg portion can be used as a spacer, making it possible to eliminate the space insertion process in the manufacturing process of semiconductor packages.

DETAILED DESCRIPTION OF THE INVENTION

Figure 1:
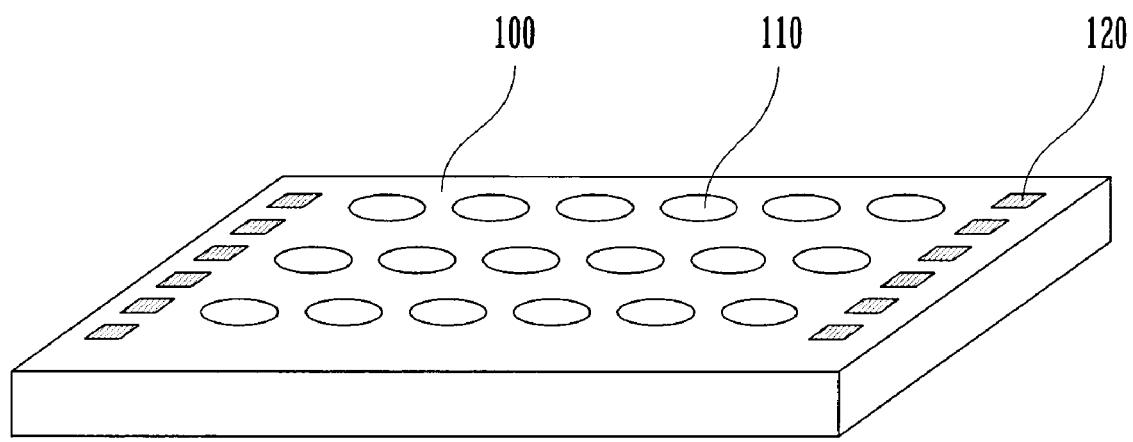
FIG. 1 is an external view of a semiconductor chip mounted and sealing sub-board according to the present invention.
Figure 2:
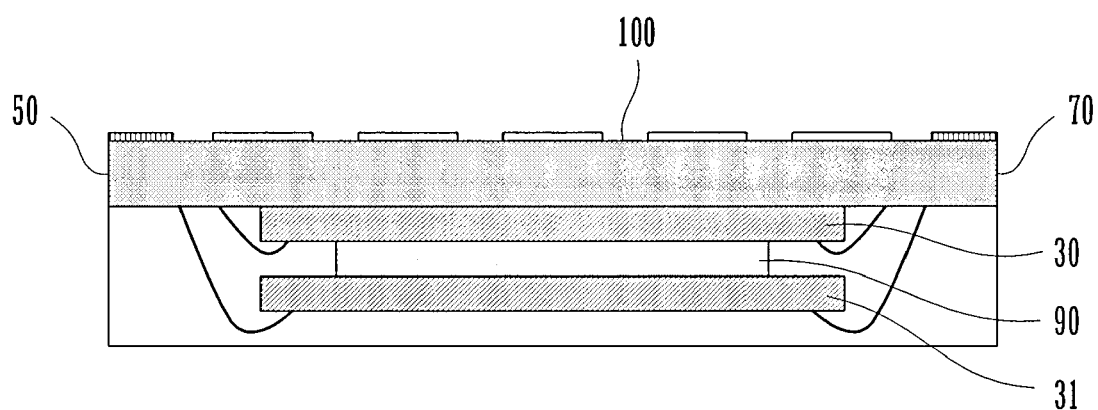
FIG. 2 is a cross-sectional view of the semiconductor chip mounted and sealing sub-board of FIG. 1.

FIG. 1 is an external view of a semiconductor chip mounted and sealing sub-board (a sub-board constituted by mounting and sealing semiconductor chips on an interposer) 100 according to an embodiment of the present invention. FIG. 2 is a cross-sectional view of the semiconductor chip mounted and sealing sub-board 100 shown in FIG. 1.

A semiconductor bare chip 30 is mounted on an interposer 70 and a spacer 90 is stacked under this, and below that is stacked a semiconductor bare chip 31. The semiconductor chip mounted and sealing sub-board 100 is this semiconductor chip mounted sub-board 50 which has been resin-sealed.

Figure 3:
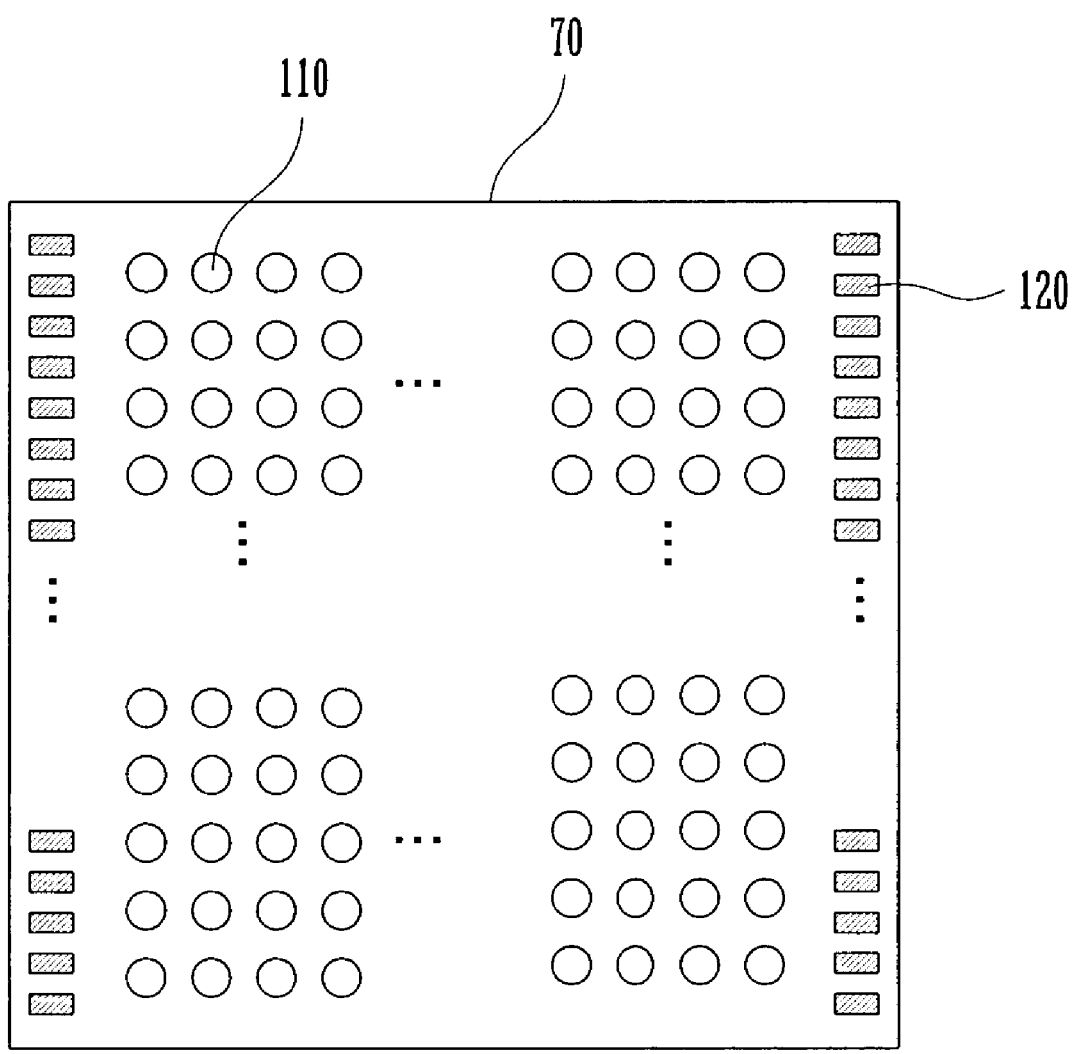
FIG. 3 is a top view of an interposer 70 shown in FIG. 2.

FIG. 3 is a top view of the interposer 70 shown in FIG. 2, with electrodes 110 for testing and electrodes 120 for mounting arranged on its surface. The electrodes 110 for testing are, for example, arranged in a 14×14 array, and have a pitch of 0.8 mm. This is the same level as the electrode pitch of a CSP chip. Accordingly, measurement of these electrodes for testing can be done with a test using a conventional socket method. The electrodes 120 for mounting are, for example arranged 96 on a side, and have a pitch of 130 μm. This is the same level as the electrode pitch of a bare chip. Accordingly, wiring of the electrodes 120 for mounting to a lead frame can be done using conventional wiring equipment.

Figure 4:
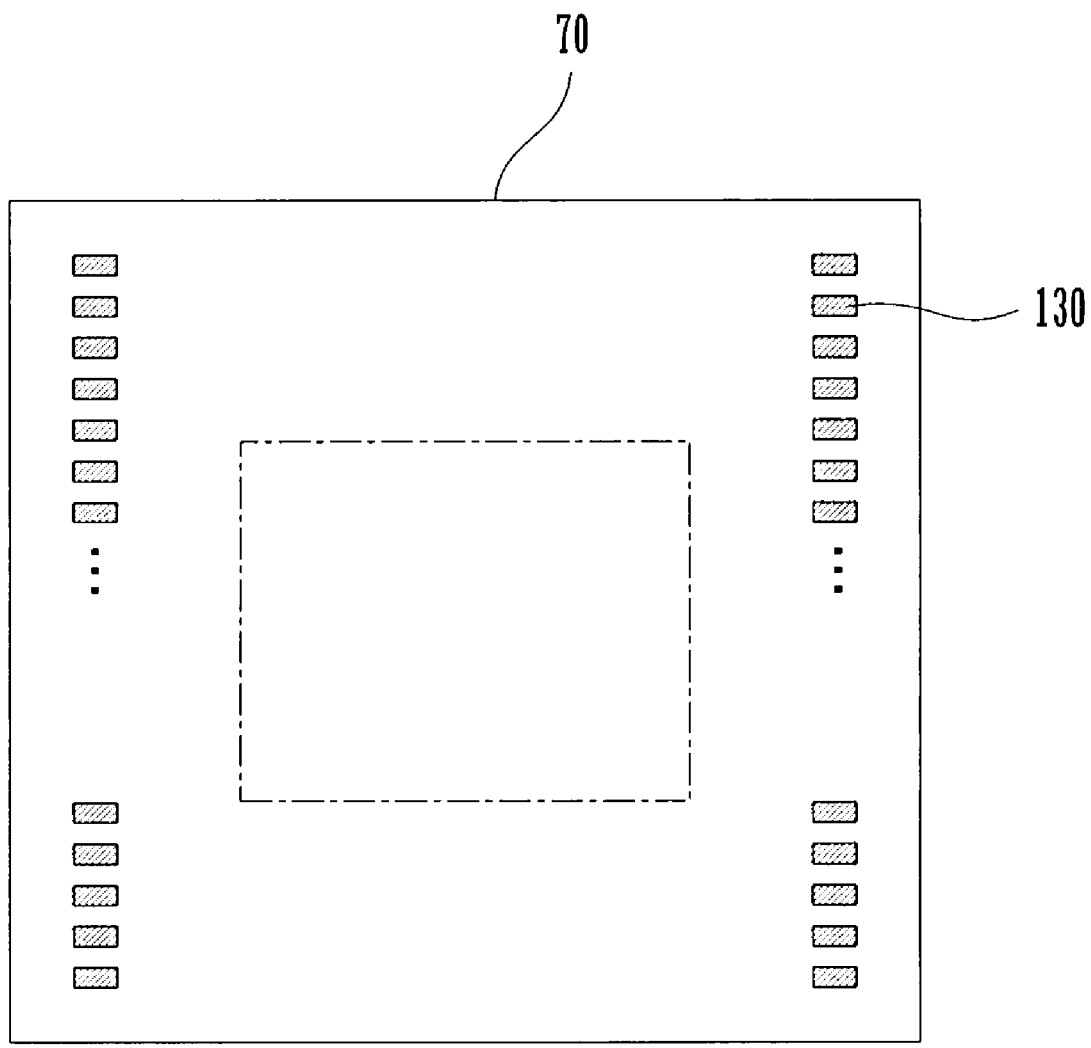
FIG. 4 is a bottom view of an interposer 70 shown in FIG. 2.

FIG. 4 is a bottom view of the interposer 70 shown in FIG. 2. The semiconductor bare chip 30 disposed on the interposer 70 is wired to internal electrodes 130. The internal electrodes 130 are, for example, arranged 36 on a side, and have a pitch of 160 μm.

Figure 5:
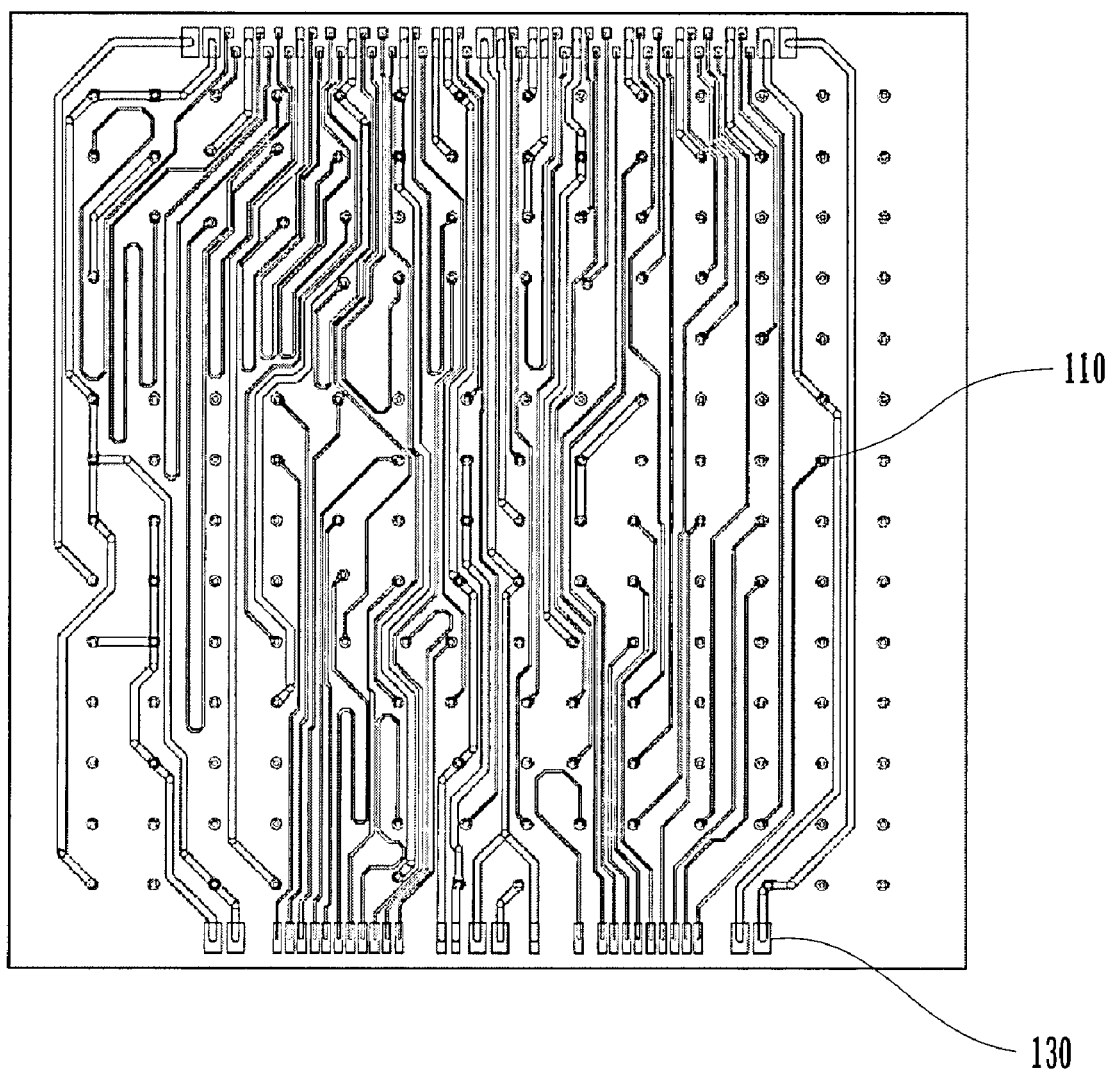
FIG. 5 is a view showing a connection pattern of a first layer in the interposer mutually connecting internal electrodes with electrodes for testing.
Figure 6:
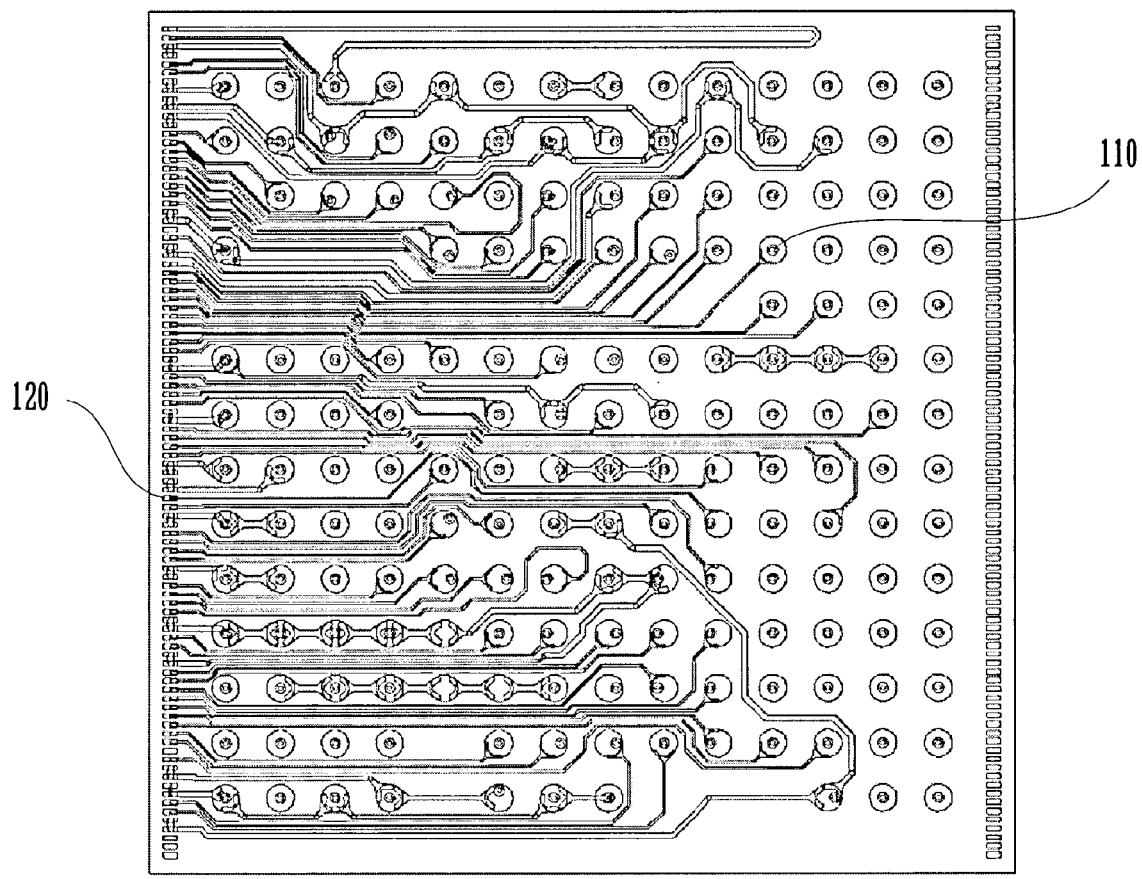
FIG. 6 is a view showing a connection pattern of a second layer in the interposer mutually connecting electrodes for testing and electrodes for mounting.

Mutually connection of the internal electrodes 130, the electrodes 110 for testing, and the electrodes 120 for mounting is realized with the internal wiring of the interposer 70. FIG. 5 shows the connection pattern of a first layer mutually connecting the internal electrodes 130 and the electrodes 110 for testing. FIG. 6 shows the connection pattern of a second layer mutually connecting the electrodes 110 for testing and the electrodes 120 for mounting. By using two layers, mutual connections between the internal electrodes, the electrodes for testing, and the electrodes for mounting are realized without increasing the area of the substrate. By using multiple layers of wiring in the interposer, an arbitrary arrangement of the electrodes for testing and an arbitrary arrangement of the electrodes for mounting can be realized.

Figure 7:
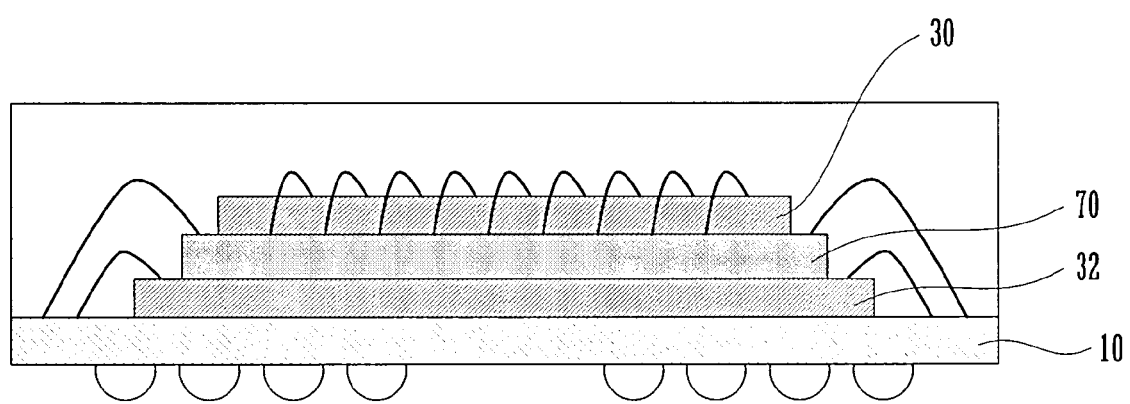
FIG. 7 is a view showing an example of a case according to the present invention in which internal wiring of the interposer makes possible electrical connections from semiconductor bare chips to a package substrate beyond a scope of possible connections with wires.
Figure 15:
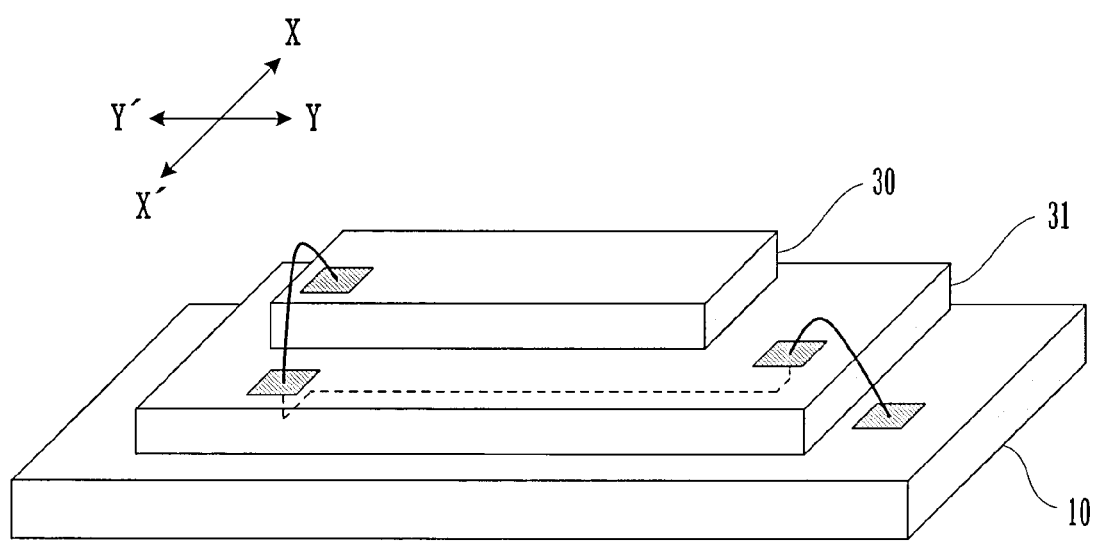
FIG. 15 is a view showing an example of a conventional SIP.

FIG. 7 is an application of the ability to realize arbitrary electrode connections by using multiple layers of wiring in the interposer to the concept of Japanese Laid-Open Patent Publication No. 2001-196529. The semiconductor bare chip 30 of FIG. 7 is equivalent to the semiconductor bare chip 30 of FIG. 15, and the interposer 70 of FIG. 7 plays the role of the semiconductor bare chip 31 in FIG. 15. In other words, the internal wiring of the interposer 70 makes possible electric connection of the semiconductor bare chip 30 to the package substrate 10 beyond the scope of possible connection with wires.

Figure 8:
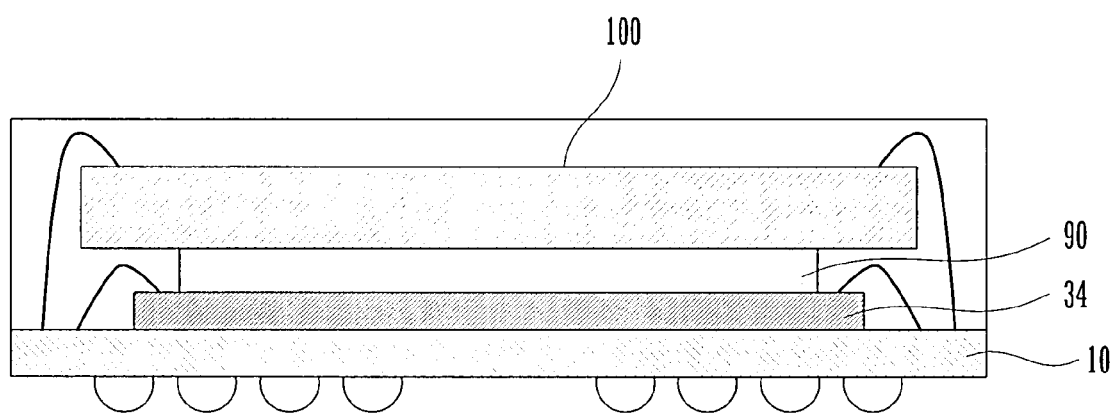
FIG. 8 is a view showing an example of a case according to the present invention in which the semiconductor chip mounted and sealing sub-board and semiconductor bare chips are made into an SIP.

FIG. 8 shows an example of a case in which the semiconductor chip mounted and sealing sub-board 100 and the semiconductor bare chip 34 are made in a SIP. In this case, since the semiconductor chip mounted and sealing sub-board 100 is approximately the same size as the semiconductor bare chip 34, a spacer 90 is inserted between the semiconductor chip mounted and sealing sub-board 100 and the semiconductor bare chip 34 so that a bonding pad portion of the bottom chip is not hidden.

Figure 9:
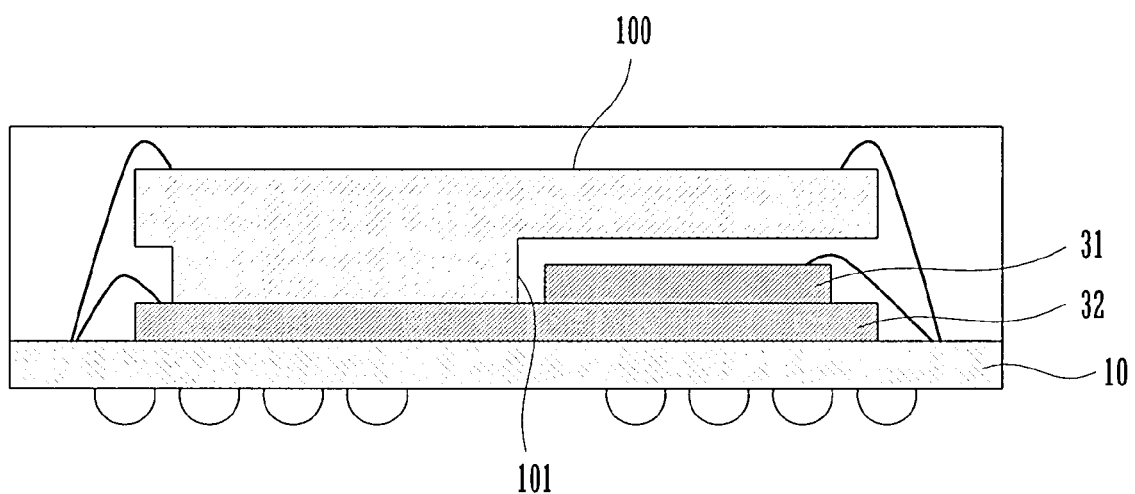
FIG. 9 is a view showing an example of a case according to the present invention in which the semiconductor chip mounted and sealing sub-board provided with protrusions and semiconductor bare chips are made into an SIP.

In FIG. 8, the spacer 90 was used, but a leg portion which performs the role of a spacer can also be provided to the semiconductor chip mounted and sealing sub-board 100. FIG. 9 shows provision of a leg portion to the semiconductor chip mounted and sealing sub-board 100. This leg portion can be realized by making a mold into a desired shape. The leg portion is attached to the semiconductor bare chip 32, creating a wiring space from the semiconductor bare chip 32 and a wiring space from the semiconductor bare chip 31.

Figure 10:
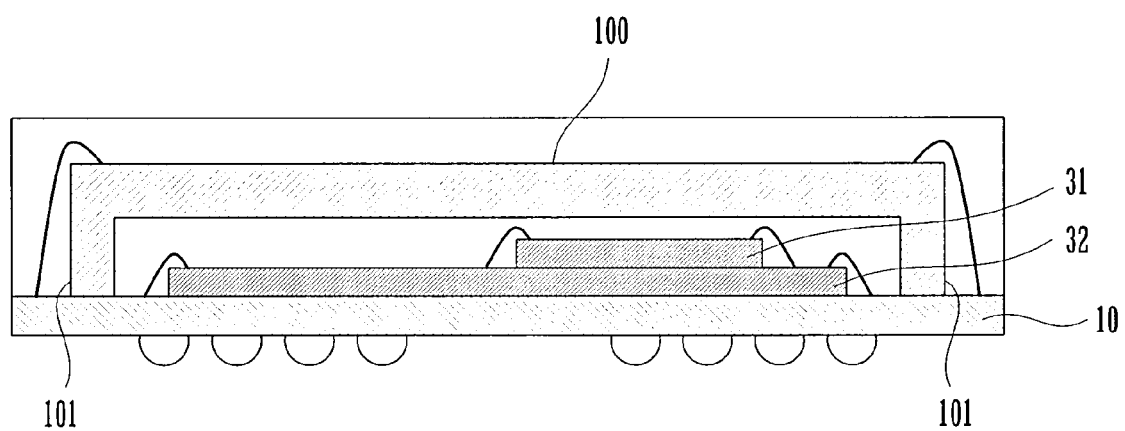
FIG. 10 is a view showing an example of a case according to the present invention in which the semiconductor chip mounted and sealing sub-board provided with protrusions and semiconductor bare chips are made into an SIP.

FIG. 10 shows a different embodiment in which the leg portions are provided to the semiconductor chip mounted and sealing sub-board 100, similarly to FIG. 9. In FIG. 9, the leg portion provided to the semiconductor chip mounted and sealing sub-board is attached to the semiconductor bare chip 32, but in FIG. 10 the leg portions provided to the semiconductor chip mounted and sealing sub-board 100 are attached to the package substrate 10. The semiconductor bare chips 31 and 32 are disposed in the space formed between the semiconductor chip mounted and sealing sub-board 100 and the package substrate 10, making wiring possible.

Figure 11:
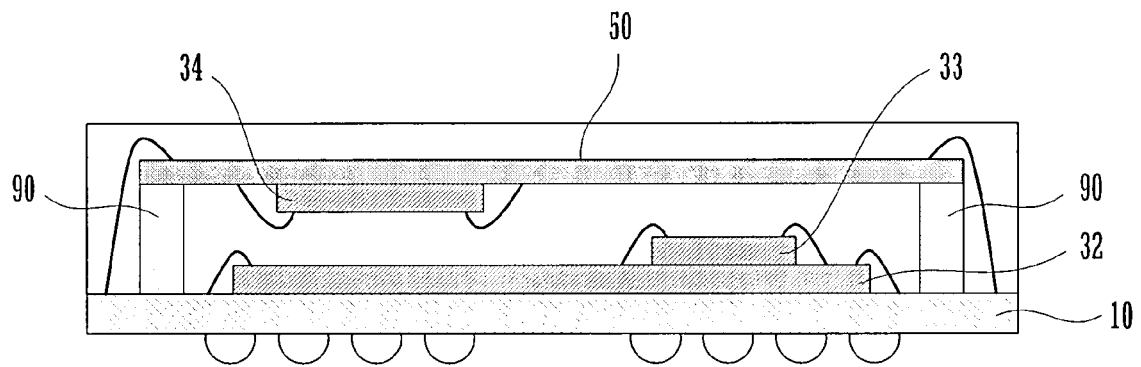
FIG. 11 is a view showing an example of a case according to the present invention in which a semiconductor chip mounted sub-board is stacked on the package substrate via spacers and resin-sealed together with the semiconductor bare chips.

FIG. 11 shows stacking of an un-resin-sealed semiconductor chip mounted sub-board 50 on the package substrate 10 via the spacers 90. The semiconductor bare chip 34 is mounted ahead of time on the semiconductor chip mounted sub-board 50. In addition to the semiconductor chip mounted sub-board 50, the semiconductor bare chip 32 and the semiconductor bare chip 33 are stacked and then everything is resin-sealed.

Figure 12:
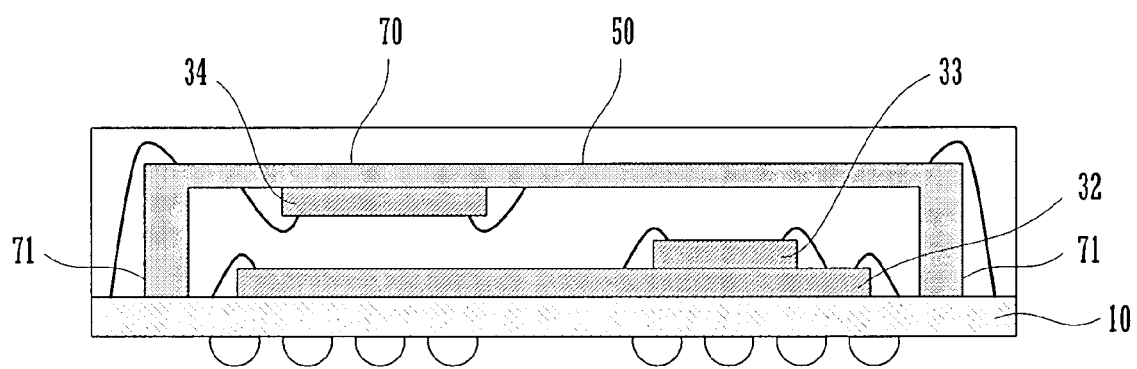
FIG. 12 is a view showing an example of a case according to the present invention in which a semiconductor chip mounted sub-board having an interposer provided with protrusions is stacked on the package substrate and resin-sealed together with the semiconductor bare chips.
Figure 13:
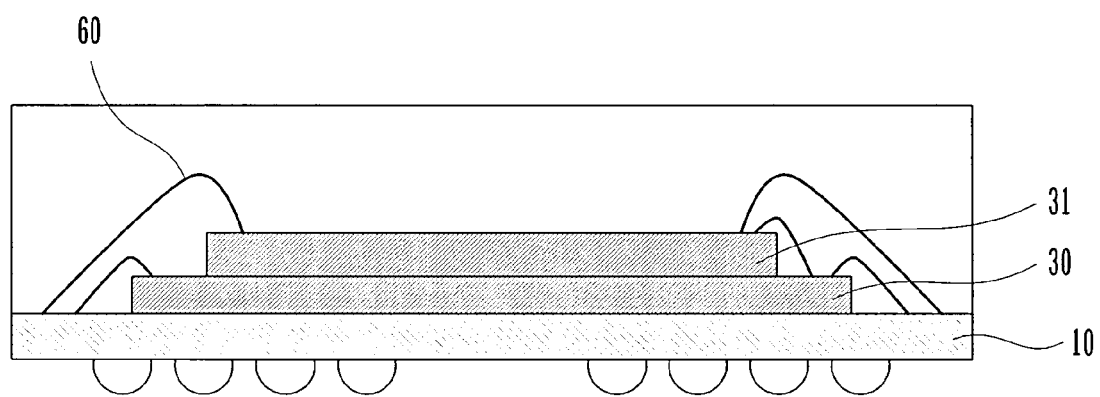
FIG. 13 is a view showing an example of a conventional SIP.
Figure 14:
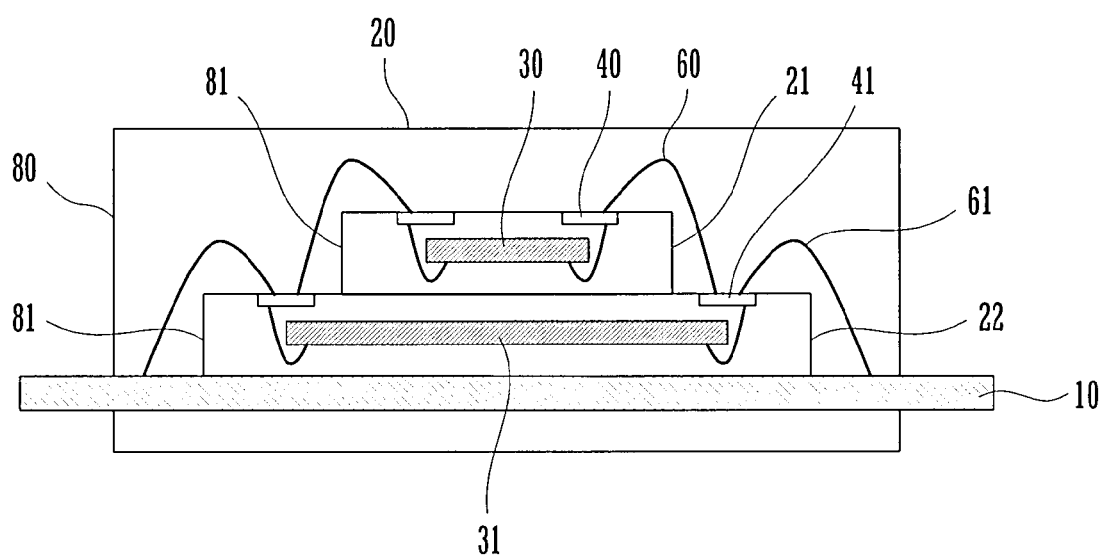
FIG. 14 is a view showing an example of a conventional SIP.

The semiconductor chip mounted sub-board 50 of FIG. 11 is stacked via the spacers 90, but the leg portion may be provided to the interposer 70 and made to play the role of the spacers. FIG. 12 shows a structure in which the leg portions are provided to the interposer 70. In this case, too, it is possible to sealing everything together.

With this embodiment, the arrangement of the internal electrodes, the arrangement of the electrodes for testing, and the arrangement of the electrodes for mounting can be set arbitrarily by realizing mutual connections of the internal wiring, the electrodes for testing, and the electrodes for mounting with multi-layer wiring, enabling selection of an arrangement of the electrodes for testing suitable for testing methods and an arrangement of electrodes for mounting suitable for mounting conditions, with respect to semiconductor chips with a variety of pad arrangements.

What is claimed is:

1. A semiconductor package comprising:
   a package substrate;
   a first semiconductor bare chip mounted on a surface of the package substrate;
   an interposer arranged parallel to the package substrate, the interposer having an upper surface and a lower surface;
   a second semiconductor bare chip mounted on the lower surface of the interposer, the second semiconductor bare chip opposing to the first semiconductor bare chip;
   a plurality of first electrodes formed on the lower surface of the interposer, and electrically connected to the second semiconductor bare chip respectively;
   a plurality of second electrodes formed on the upper surface of the interposer and arranged in substantially matrix with a pitch greater than an electrode pitch of the second semiconductor bare chip; and
   a plurality of third electrodes formed on the upper surface of the interposer and arranged in line with a pitch smaller than the pitch of the plurality of second electrodes, and arranged along at least one side of the interposer;
   wherein,
   the package substrate and one of the plurality of third electrodes are electrically connected; and
   one of the plurality of the first electrodes, one of the plurality of second electrodes and one of the plurality of third electrodes are electrically connected together.

2. The semiconductor package according to claim 1 wherein:
   each of the plurality of second electrodes has a circular shape; and
   each of the plurality of third electrodes has a rectangular shape.

3. The semiconductor package according to claim 1 wherein
   the package substrate and the one of the plurality of third electrodes are electrically connected by a wiring.

4. The semiconductor package according to claim 1 wherein
   the second semiconductor bare chip and the plurality of first electrodes are electrically connected by wirings respectively.

5. The semiconductor package according to claim 1 wherein,
   the plurality of first electrodes are arranged at least in two lines; and
   the semiconductor package further comprises:
       a plurality of fourth electrodes formed on parts of the lower surface of the interposer, each of the fourth electrodes being electrically connected to corresponding one of the plurality of second electrodes, the plurality of the fourth electrodes being arranged in substantially matrix and, the plurality of fourth electrodes being electrically connected to the plurality of second electrodes respectively; and
       first connection patterns formed on the lower surface of the interposer, each of the first connection patterns electrically connecting each of the plurality of fourth electrodes and each of the plurality of first electrodes respectively.

6. The semiconductor package according claim 5 wherein, some of the first connection patterns are wider than other ones of the first connection patterns.

7. The semiconductor package according claim 6 wherein, the wider one of the first connection patterns connects plural ones of fourth electrodes to one of the first electrodes.

8. The semiconductor package according to claim 1 further comprising:
   second connection patterns formed on the upper surface of the interposer, each of the second connection patterns electrically connecting each of the plurality of second electrodes and each of the plurality of third electrodes respectively.

9. The semiconductor package according to claim 5 further comprising:
   second connection patterns formed on the upper surface of the interposer, each of the second connection patterns electrically connecting each of the plurality of second electrodes and each of the plurality of third electrodes respectively.

10. The semiconductor package according to claim 8 further comprising:
    at least one of the second connection patterns is U turned.

11. A semiconductor package comprising:
    a package substrate;
    a first semiconductor bare chip mounted on a surface of the package substrate, the first semiconductor bare chip having a bonding pad;
    a first wire electrically connecting the bonding pad of the first semiconductor bare chip and the package substrate;
    a spacer arranged over a part of the first semiconductor bare chip and not over the bonding pad of the first semiconductor bare chip; and
    a sealed sub-board mounted on the spacer, the sealed sub-board being larger than the spacer, the sealed sub-board comprising:
        a second semiconductor bare chip;
        a interposer having an upper surface and a lower surface on which the second semiconductor bare chip is mounted;
        a plurality of first electrodes formed on the lower surface, the plurality of first electrodes being electrically connected to the second semiconductor bare chip;
        a plurality of second electrodes formed on the upper surface and arranged in substantially matrix with a pitch greater than an electrode pitch of the second semiconductor bare chip;
        a plurality of third electrodes formed on the upper surface and arranged in line with a pitch smaller than the pitch of the plurality of second electrodes, the plurality of third electrodes arranged along at least one edge of the interposer; and
        a first resin for sealing the lower surface of the interposer and the second semiconductor bare chip,
    wherein:
    the sealed sub-board is stacked over the spacer; and
    one of the plurality of third electrodes and the package substrate are electrically connected by a second wire.

12. The semiconductor package according do claim 11 further comprising:
    a second resin for sealing the surface of the package substrate, the first semiconductor bare chip, the first wire, the spacer, the sealed sub-board and the second wire,
    wherein the first resin and the second resin are formed in different processes.

13. The semiconductor package according to claim 11 wherein:
   each of the plurality of second electrodes has a circular shape; and
   each of the plurality of third electrodes has a rectangular shape.

14. The semiconductor package according to claim 11 wherein
   the second semiconductor bare chip and the plurality of first electrodes are electrically connected by wirings respectively.

15. The semiconductor package according to claim 11 wherein,
   the plurality of first electrodes are arranged at least in two lines; and
   the sealed sub-board further comprises:
      a plurality of fourth electrodes formed on parts of the lower surface of the interposer, each of the fourth electrodes being electrically connected to corresponding one of the plurality of second electrodes, the plurality of the fourth electrodes being arranged in substantially matrix and, the plurality of fourth electrodes being electrically connected to the plurality of second electrodes respectively; and
      first connection patterns formed on the lower surface of the interposer, each of the first connection patterns electrically connecting each of the plurality of fourth electrodes and each of the plurality of first electrodes respectively.

16. The semiconductor package according claim 15 wherein,
   some of the first connection patterns are wider than other ones of the first connection patterns.

17. The semiconductor package according claim 16 wherein,
   the wider one of the first connection patterns connects plural ones of fourth electrodes to one of the first electrodes.

18. The semiconductor package according claim 11 further comprising:
   second connection patterns formed on the upper surface of the interposer, each of the second connection patterns electrically connecting each of the plurality of second electrodes and each of the plurality of third electrodes respectively.

19. The semiconductor package according claim 15 further comprising:
   second connection patterns formed on the upper surface of the interposer, each of the second connection patterns electrically connecting each of the plurality of second electrodes and each of the plurality of third electrodes respectively.

20. The semiconductor package according claim 18 further comprising:
   at least one of the second connection patterns is U turned.

* * * * *